(12) United States Patent
Sverdlov et al.

(10) Patent No.: US 6,819,702 B2
(45) Date of Patent: Nov. 16, 2004

(54) PUMP LASER DIODE WITH IMPROVED WAVELENGTH STABILITY

(75) Inventors: Boris Sverdlov, Adliswil (CH); Berthold Schmidt, Erlenbach (CH)

(73) Assignee: Bookham Technology plc, Abingdon (GB)

( * ) Notice: Subject to any disclaimer, the term of this patent is extended or adjusted under 35 U.S.C. 154(b) by 0 days.

(21) Appl. No.: 10/242,497

(22) Filed: Sep. 11, 2002

(65) Prior Publication Data

US 2004/0047390 A1 Mar. 11, 2004

(51) Int. Cl.[7] .................................................. H01S 3/08
(52) U.S. Cl. ......................................... 372/102; 372/92
(58) Field of Search ........................... 372/92, 102, 46, 372/97

(56) References Cited

U.S. PATENT DOCUMENTS

| | | | | |
|---|---|---|---|---|
| 4,358,851 A | * | 11/1982 | Scifres et al. ................... | 372/97 |
| 5,056,099 A | | 10/1991 | Bradley ......................... | 372/49 |
| 5,978,400 A | * | 11/1999 | Campbell et al. .............. | 372/46 |
| 6,021,141 A | * | 2/2000 | Nam et al. ...................... | 372/20 |
| 6,226,311 B1 | * | 5/2001 | Meliga et al. ................. | 372/102 |
| 6,323,052 B1 | * | 11/2001 | Horie et al. .................... | 438/46 |
| 2003/0035459 A1 | * | 2/2003 | Wilson et al. ................. | 372/97 |
| 2003/0058905 A1 | * | 3/2003 | Crawford et al. ........ | 372/29.02 |

FOREIGN PATENT DOCUMENTS

| EP | 0 991 153 A1 | 4/2000 |
|---|---|---|
| JP | 58110087 | 6/1983 |

OTHER PUBLICATIONS

Fitz et al; Short–cavity, edge–emitting lasers with high–reflectance, dielectric mirrors; Applied Physics Letters; vol. 77, No. 12; Sep. 18, 2000; pp. 1756–1758.
PCT/GB03/03820; International Search Report mailed Dec. 2, 2003.

* cited by examiner

*Primary Examiner*—Don Wong
*Assistant Examiner*—Hung Tran Vy
(74) *Attorney, Agent, or Firm*—Renner, Otto, Boisselle & Sklar, LLP

(57) ABSTRACT

A pump laser diode for providing improved stability at various operating temperatures is disclosed. It includes a Fabry-Perot cavity formed by laser facets. Bragg Gratings or Fiber Bragg Gratings (FBG) in a pump module are provided, wherein the optical mirror losses are made to increase for wavelengths longer than the required emission wavelength, thus permitting the diode to be locked to an emission wavelength while operating at different temperatures. A stack of materials with different refractive indices is deposited on the back facet of the laser diode to achieve a change in optical mirror losses over longer wavelengths.

11 Claims, 6 Drawing Sheets

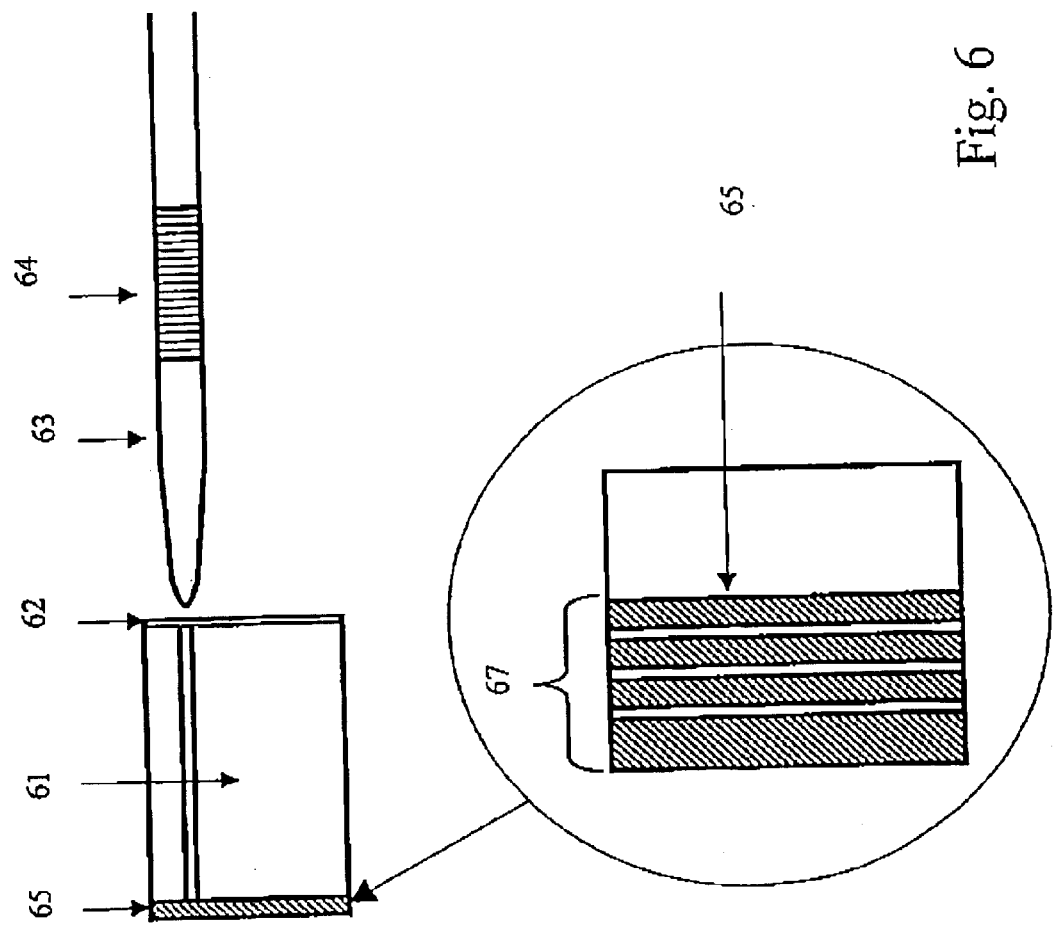

PUMP LASER DIODE WITH IMPROVED WAVELENGTH STABILITY

CROSS-REFERENCE TO RELATED APPLICATIONS

N/A

STATEMENT REGARDING FEDERALLY SPONSORED RESEARCH

N/A

REFERENCE TO SEQUENCE LISTING

N/A

BACKGROUND OF THE INVENTION

This invention relates generally to Laser Diodes and more particularly to Pump Laser Diodes offering improved wavelength stability through use of Fabry-Perot cavity and Fiber Bragg Gratings.

Laser diodes, which are used as pumps at an operating wavelength of approximately 980 nm in erbium-doped fiber amplifiers, are stabilized around this wavelength for efficient pumping. However, the emission wavelength of the laser with a conventional Fabry-Perot cavity formed by laser facets tends to change with the temperature of the laser. The temperature change can be environmental and/or induced by the Joule heating of the diode at increased forward currents.

BRIEF SUMMARY OF THE INVENTION

According to a first aspect of the present invention, there is provided a pump laser diode for providing improved stability at higher operating temperatures. The pump laser diode includes a Fabry-Perot cavity formed by laser facets and Fiber Bragg Gratings (FBG) in a pump module, wherein facet optical mirror losses are made to increase for wavelengths longer than the required emission wavelength, thus permitting the diode to be locked to the emission wavelength while operating at higher temperatures.

In a further aspect of the invention, a stack of materials with different refractive indices is deposited on the back facet of the laser diode.

Another aspect of the present invention provides a method for providing improved stability at higher operating temperatures for a pump laser diode. The method includes providing light from a pump module into a Fabry Perot cavity having mirror optical losses, and increasing the mirror optical losses of the cavity at a wavelength that is not the emission wavelength.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The invention and its embodiments thereof will be described in conjunction with the accompanying drawings in which:

FIG. 6 is a diagram illustrating a semiconductor laser diode having a Fabry-Perot cavity formed by coated laser facets according to the present invention.

DETAILED DESCRIPTION

Figure 1:
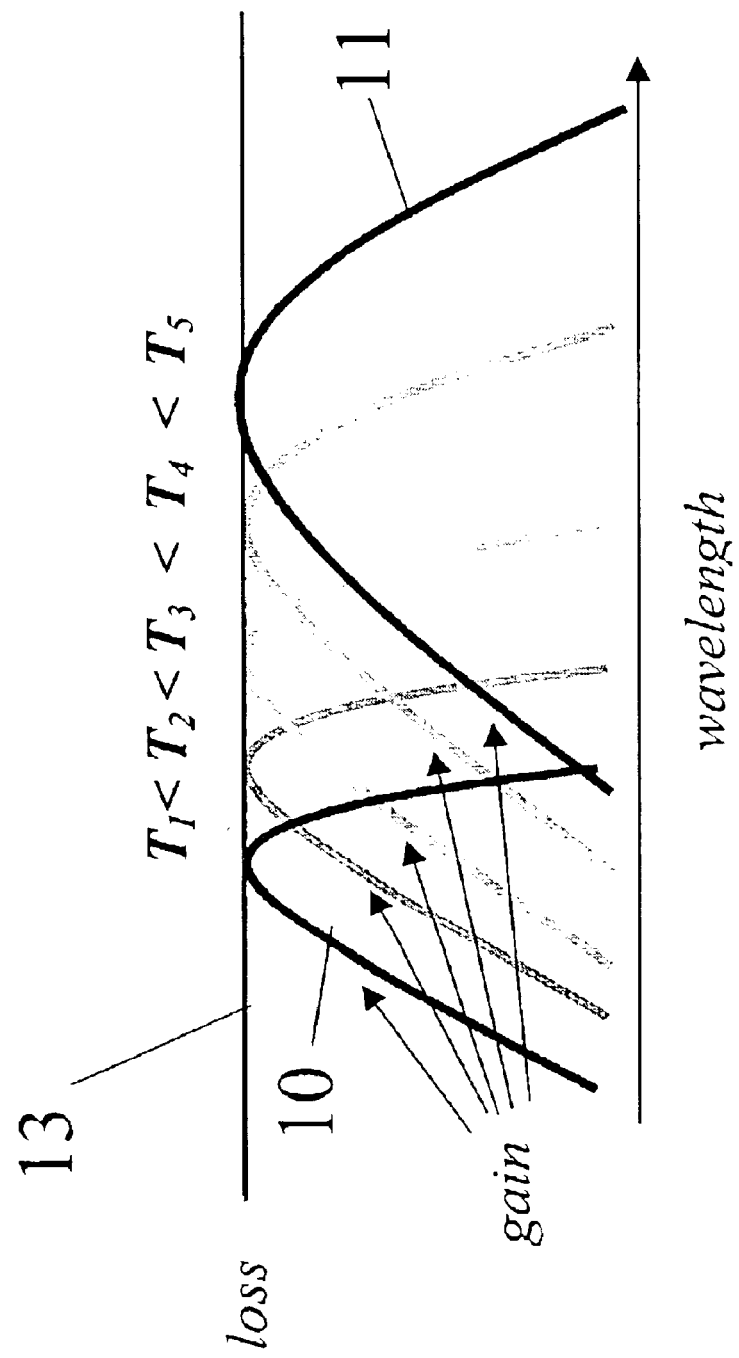
FIG. 1. is a graph illustrating the temperature-dependent gain spectra at threshold for a Fabry-Perot pump laser diode.

FIG. 1 is a chart illustrating the temperature-dependent gain spectra at threshold for a conventional Pump Laser Diode module. In general, this chart illustrates that a) the laser threshold is reached when the gain of the laser reaches the loss value, b) the magnitude of the gain for a given current is a function of the wavelength, and c) as temperature increases, the gain spectrum broadens and the maximum of the gain spectrum shifts to longer wavelengths. As an example, in FIG. 1, the spectrum of the gain curve 10 for temperature T1 is narrower than the spectrum of gain curve 11 at temperature T5.

Along with the gain maximum shifting to longer wavelengths with increasing temperature so does the emission wavelength. The magnitude of this shift for a temperature range of 0° C. –75° C. could be as high as 40 nm. This is not desirable for the pump laser diodes.

Figure 2:
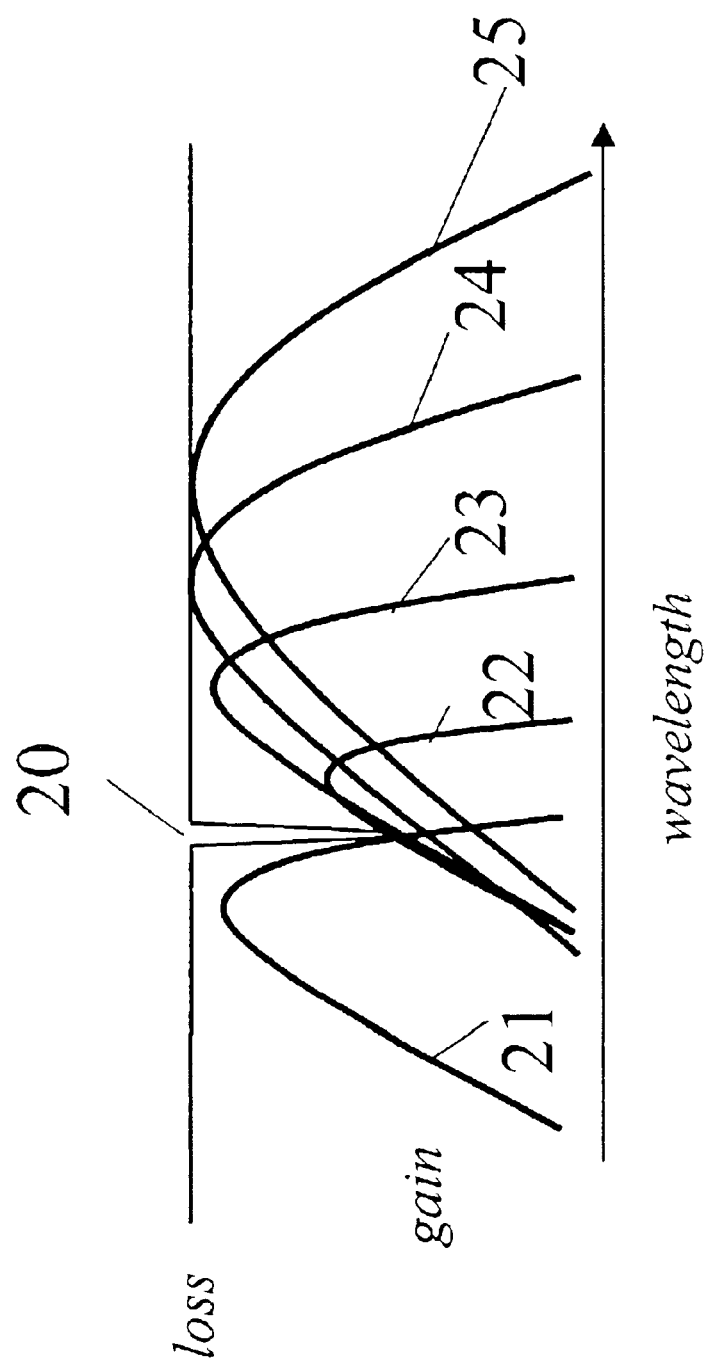
FIG. 2. is a graph illustrating the temperature-dependent gain spectra for a Fabry-Perot laser with Fiber Bragg Grating (FBG) feedback.

To stabilize the laser diode emission at a given wavelength, say 980 nm, a fiber Bragg grating (FBG) is used in the pump modules. In these modules part of the light launched from the pump module into the output fiber reflects back from the FBG into the laser. In a 980 nm FBG pump laser, since FBG is reflective in only a very narrow wavelength range around 980 nm, this reflection selectively decreases the laser output loss at this wavelength. This is schematically illustrated in FIG. 2, which shows the threshold gain spectra for the laser with FBG.

With the use of the FBG, the loss curve 20 is no longer a straight line. Instead, it has a narrow dip at the 980 nm wavelength of FBG. As a result, the gain curves 21, 22 and 23 of FIG. 2 all touch the loss curve at lower than maximum gain. The result is that the emission wavelength of the laser is equal to 980 nm for each of these 3 wavelengths. In other words, the laser is locked to 980 nm in a particular temperature range. It will be understood by those skilled in the art that the same principle is applicable to various emission wavelength regimes and semiconductor laser diode materials, i.e. InGaAsP, GaN, etc.

However, even with the use of FBG, the characteristics are more like those of FIG. 1 for curves 24 and 25, which correspond to higher temperatures. The gain spectra at these higher temperatures has shifted from the FBG wavelength towards longer wavelengths that touch the flat portion of the loss curve as in FIG. 1. As a result, the emission wavelength, for a wavelength above the required FBG-wavelength (e.g. 980 nm), is at the gain maximum, just as in the chart of FIG. 1. Accordingly, the laser "unlocks" from the FBG wavelength at these higher temperatures. This poses a problem when using an uncooled pump module operating in a wide temperature range.

The present invention changes the operating range of a pump diode laser. In a preferred embodiment, an FBG is employed to provide an initial locking range and then the loss level of the pump laser is increased for longer wavelengths (e.g. higher temperatures). This is illustrated in the chart of FIG. 3.

Figure 3:
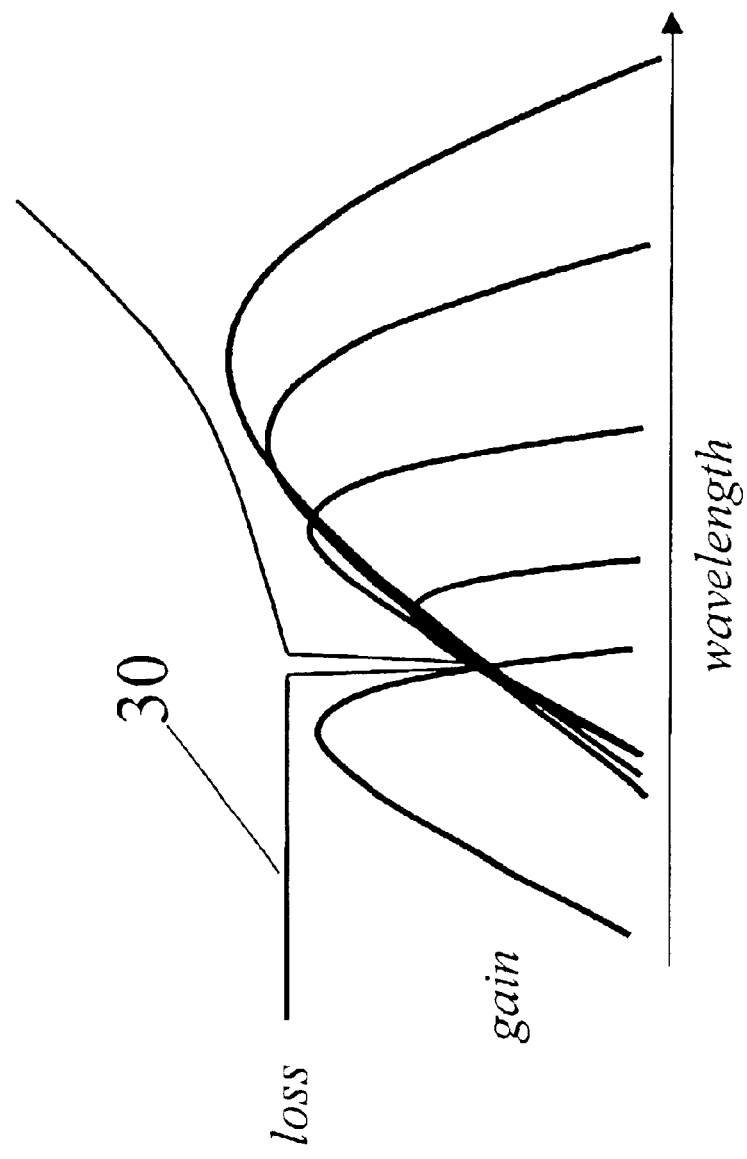
FIG. 3. is a graph illustrating a temperature-dependent gain spectra for a laser with FBG feedback and a modified loss curve.

In FIG. 3, spectra curves for a laser with FBG are shown with a modified loss curve 30. In this arrangement, the loss level 30 is made to increase for wavelengths longer than the required emission wavelength, e.g. 980 nm in the present embodiment. This provides an opportunity to pump the diode harder at higher temperatures to get enough gain for lasing at the FBG wavelength and still be below the loss level 30 even when the gain curve reaches its maximum. Thus the laser diode can be locked to FBG wavelength in a wider temperature range.

Modification of the loss level 30 can be achieved as follows. It is known that the loss in laser diode (a) is in general the sum of internal loss and mirror loss. This is described as:

$$a=a_i+a_m=a_i+(1/2L)ln(1/R1R2)$$

wherein $a_i$ is the internal loss $a_m$ is the mirror loss

L is cavity length

R1 is the reflectivity of the front mirror 62 (FIG. 6) and R2 is the reflectivity of back mirror 65 (FIG. 6).

Internal loss $a_i$, is mostly determined by free carrier absorption. It is relatively wavelength independent in the required spectral range. However, the mirror reflectivity can drastically depend on the wavelength. Consider the reflectivity R2 of the back mirror 65 in FIG. 6. The back mirror 65 in a typical pump laser device can have a reflectivity R2 of approximately 0.9–0.98. To achieve this reflectivity a quarter-wavelength stack of materials 67 with different refractive indices is deposited on the back facet 65 of the laser. An example of reflectivity spectrum for a seven-layer quarter-wavelength stack with design wavelength at 980 nm is presented in FIG. 4.

Figure 4:
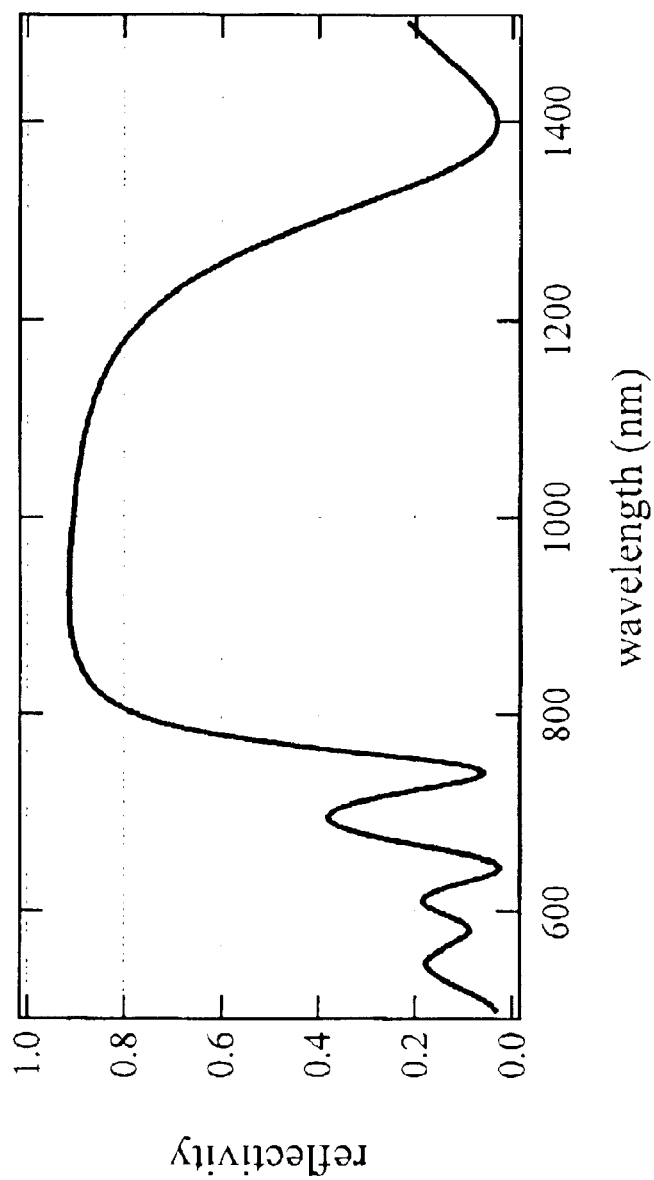
FIG. 4. is a graph of a typical back facet reflectivity curve.
Figure 5:
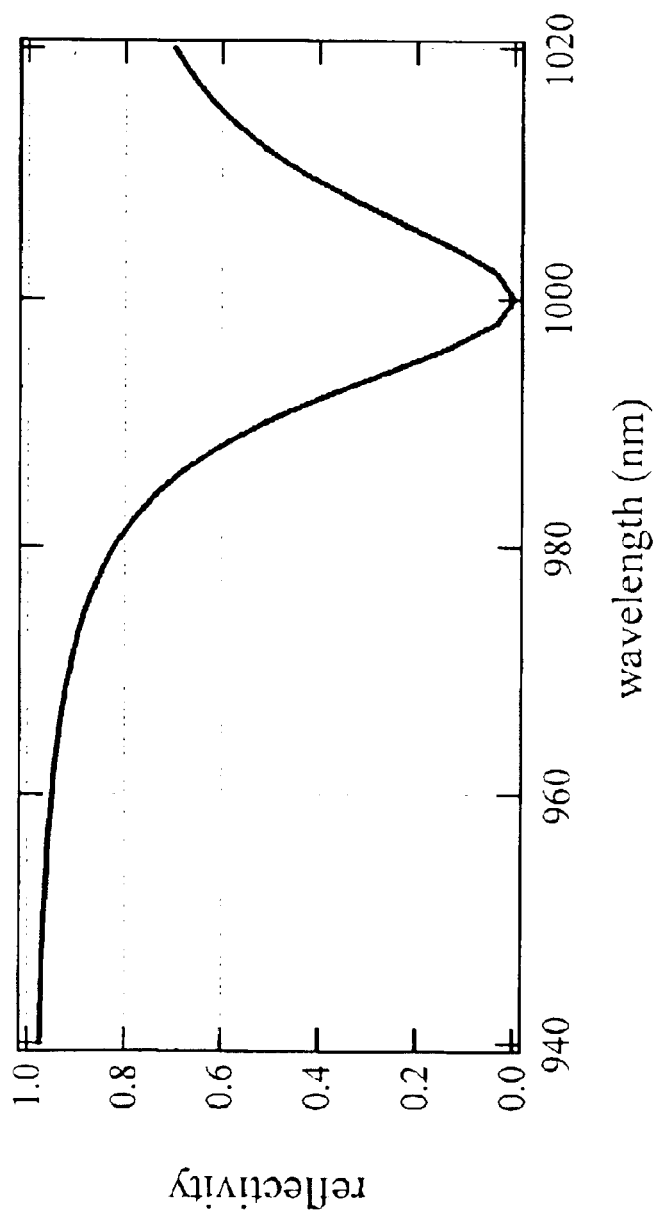
FIG. 5. is a graph of a wavelength-shifted reflectivity of nine-layer Si/SiO2 stack.

In FIG. 4, the change of reflectivity is minimal at 980 nm±20 nm. This means that the loss level in this interval is practically wavelength-independent. But those skilled in the art will recognize that the transition from high to low reflectivity on this reflectivity curve is very steep both on the short and long wavelength shoulders of the curve. Thus, if these regions of steep reflectivity change fall to the spectral interval of interest, increasing losses for undesirable wavelengths is achieved. As an example, FIG. 5 shows the reflectivity spectrum of a nine-layer Si/SiO2 stack in the wavelength region 940 nm–1020 nm. In this, mirror reflectivity drops to zero over a 20 nm wavelength span, (i.e. from 980 nm to 1000 nm). This leads to a significant increase in the loss value for longer wavelengths of the required gain spectra. This loss increase suppresses unlocking of FBG-coupled laser in a higher temperature range.

In an alternate embodiment of the invention, the laser could be employed without the use of the FBG but with the mirror of FIG. 5. Thus, while the laser would not necessarily be locked to a particular wavelength, it would only operate at wavelengths below a particular wavelength.

FIG. 6 illustrates a block diagram of a laser diode having a Fabry-Perot cavity formed by coated laser facets according to the present invention. The waveguide 61 of the laser diode is provided with a front facet coating 62 adapted to receive light via an optical fiber coupler 63. Wavelength stabilization is provided by means of Fiber-Bragg grating 64. The waveguide 61 also includes a reflective back facet laser coating 65 formed from of a dielectric mirror stack 67. The dielectric mirror stack 67 provides additional wavelength stabilization by modifying the reflectivity of the back facet, such that the back facet 65 offers a high reflectivity at FBG operating wavelength and low reflectivity at wavelengths longer than the FBG-stabilized emission wavelength.

It will be recognized by those skilled in the art that other materials or materials with modified properties can be used for desired reflectivity modification at various wavelengths. In addition, with low front facet reflectivities, a slight decrease of back facet reflectivity, here at 980 nm, does not bring noticeable decrease in the power emitted from the front facet.

Spectral reflectivity of the front mirror can also be tailored to introduce additional loss at wavelengths other than 980 nm. For example, W-coating where reflectivity decreases on both sides of a desired wavelength, can be used. The tailoring of the front facet reflectivity can be also used to suppress emission at shorter wavelengths (lower temperatures). Again, the design principle is not restricted to InGaAs/GaAs based laser diodes emitting at around 980 nm. The same principle can also be used to improve laser diode wavelength stabilization from an external mirror at various wavelengths, e.g. 1480 nm or 1550 nm, etc.

A solution also lies in control of spectral gain in the quantum well laser. The use of an active media where gain maximum does not shift with temperature as fast as it shifts in a present quantum well can for example be proposed. Alternatively the gain spectra can be so spectrally wide that there will not be too much difference in gain between maximum and the design wavelength.

We claim:

1. A semiconductor laser diode, comprising: a waveguide having a front coated laser facet and a back reflective coated laser facet which together form a Fabry-Perot cavity, wherein the back reflective coated laser facet comprises a dielectric mirror stack that provides greater reflectivity at predetermined wavelength than at wavelengths which are greater than the predetermined wavelength, and a pump module optically coupled to the Fabry-Perot cavity, said pump module including a wavelength stabilizer selected from the group consisting of a Bragg Grating (BG) and a Fiber Bragg Grating (FBG) to provide a stabilized wavelength.

2. The semiconductor laser diode according to claim 1 wherein the predetermined wavelength is a range of predetermined wavelengths.

3. The semiconductor laser diode according to claim 1, wherein the back reflective coated laser facet also provides greater reflectivity at the predetermined wavelength than at wavelengths which are less than the predetermined wavelength.

4. A semiconductor laser diode, comprising: a waveguide having a front coated laser facet and a back reflective coated laser facet which together form a Fabry-Perot cavity, said back reflective coated laser facet comprising a dielectric mirror stack having a mirror optical loss associated with it, wherein said mirror optical loss is increased for wavelengths longer than a predetermined emission wavelength, and a pump module optically coupled to the Fabry-Perot cavity, said pump module including a wavelength stabilizer selected from the group consisting of a Bragg Grating (BG) and a Fiber Bragg Grating (FBG).

5. The semiconductor laser diode according to claim 4, wherein the mirror optical loss is also increased for wavelengths shorter than a predetermined emission wavelength.

6. The semiconductor laser diode according to claim 4 wherein the predetermined wavelength is a range of wavelengths.

7. A semiconductor laser diode that is stabilized at a predetermined emission wavelength, comprising: a waveguide having a front coated laser facet and a back reflective coated laser facet which together for a Fabry-Perot cavity, said back reflective coated laser facet comprising a dielectric mirror stack having a mirror optical loss associated with it, wherein said mirror optical loss is increased at a wavelength that is not the emission wavelength, and a pump module optically coupled to the Fabry-Perot cavity, said pump module including a wavelength stabilizer selected from the group consisting of a Bragg Grating (BG) and a Fiber Bragg Grating (FBG).

8. The semiconductor laser diode according to claim 7, wherein the mirror optical loss is increased at all wavelengths that are not the emission wavelength.

9. The semiconductor laser diode according to claim 7, wherein the mirror optical loss is increased at all wavelengths greater than the emission wavelength.

10. The semiconductor laser diode according to claim 7, wherein the mirror optical loss is increased at all wavelengths smaller than the emission wavelength.

11. The semiconductor laser diode according to claim 7, wherein the emission wavelength includes a range of wavelengths.

\* \* \* \* \*